(12) United States Patent
Cho et al.

(10) Patent No.: US 11,742,735 B2
(45) Date of Patent: Aug. 29, 2023

(54) MOTOR AND TRANSMISSION

(71) Applicant: LG INNOTEK CO., LTD., Seoul (KR)

(72) Inventors: Hyun Shik Cho, Seoul (KR); Hye Yeong Byeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 8 days.

(21) Appl. No.: 17/375,178

(22) Filed: Jul. 14, 2021

(65) Prior Publication Data
US 2021/0344264 A1 Nov. 4, 2021

Related U.S. Application Data

(63) Continuation of application No. 16/469,094, filed as application No. PCT/KR2018/000148 on Jan. 4, 2018, now Pat. No. 11,349,379.

(30) Foreign Application Priority Data

Jan. 4, 2017  (KR) .................. 10-2017-0001290
Jan. 17, 2017  (KR) .................. 10-2017-0007858

(51) Int. Cl.
*H02K 29/03*    (2006.01)
*H02K 11/215*   (2016.01)
(Continued)

(52) U.S. Cl.
CPC ............. *H02K 29/03* (2013.01); *H02K 1/146* (2013.01); *H02K 1/2773* (2013.01); *H02K 7/006* (2013.01);
(Continued)

(58) Field of Classification Search
CPC ......................... H02K 29/06; H02K 29/14
See application file for complete search history.

(56) References Cited

U.S. PATENT DOCUMENTS 4,217,508 A * 8/1980 Uzuka .................. H02K 29/06
318/400.29
5,142,176 A * 8/1992 Takahashi ........... F16C 32/0417
310/156.04
(Continued)

FOREIGN PATENT DOCUMENTS

| CN | 104578472 | 4/2015 |
| CN | 105048665 | 11/2015 |

(Continued)

OTHER PUBLICATIONS

International Search Report (with English Translation) and Written Opinion dated Apr. 16, 2018 issued in Application No. PCT/KR2018/000148.
(Continued)

*Primary Examiner* — Alexander Talpalatski
(74) *Attorney, Agent, or Firm* — KED & Associates LLP

(57) ABSTRACT

A motor comprises: a shaft; a rotor coupled to the shaft and including a magnet; a stator disposed outside the rotor and including a coil and a stator core; a cover disposed on an upper side of the rotor; and a magnetic sensor disposed between the cover and the rotor, wherein the magnetic sensor is disposed on an upper side of the magnet, a surface of the magnetic sensor facing the rotor is disposed below the uppermost end of the coil, and the length of the rotor in the shaft direction is longer than the length of the stator core in the shaft direction.

18 Claims, 9 Drawing Sheets

(51) Int. Cl.
*H02K 1/14* (2006.01)
*H02K 1/276* (2022.01)
*H02K 7/00* (2006.01)
*H02K 7/08* (2006.01)
*H02K 7/108* (2006.01)
*H02K 7/116* (2006.01)
*H02K 21/16* (2006.01)
*F16H 61/26* (2006.01)

(52) U.S. Cl.
CPC ............ *H02K 7/085* (2013.01); *H02K 7/108* (2013.01); *H02K 7/116* (2013.01); *H02K 11/215* (2016.01); *H02K 21/16* (2013.01); *F16H 61/26* (2013.01); *H02K 2213/03* (2013.01)

(56) References Cited

U.S. PATENT DOCUMENTS

| | | | | |
|---|---|---|---|---|
| 5,325,006 | A * | 6/1994 | Uno | F16C 33/1035 310/156.04 |
| 5,417,507 | A * | 5/1995 | Uno | G02B 26/121 384/107 |
| 6,700,279 | B1 * | 3/2004 | Uchiyama | H02K 29/06 310/190 |
| 8,505,674 | B2 * | 8/2013 | Neubauer | B62D 5/0403 180/443 |
| 9,647,501 | B2 * | 5/2017 | Nigo | H02K 1/2773 |
| 9,812,932 | B2 * | 11/2017 | Kitaji | H02K 29/08 |
| 10,256,681 | B2 * | 4/2019 | Bastien | H02K 1/278 |
| 10,320,274 | B2 * | 6/2019 | Yang | H02K 1/2766 |
| 10,686,342 | B2 * | 6/2020 | Park | H02K 1/2773 |
| 11,101,709 | B2 * | 8/2021 | Watanabe | H02K 29/03 |
| 2006/0006747 | A1 * | 1/2006 | Kadowaki | H02K 29/14 310/68 B |
| 2006/0071563 | A1 * | 4/2006 | Fujii | H02K 1/2733 310/68 B |
| 2008/0030093 | A1 * | 2/2008 | Maeda | H02K 1/2773 310/156.01 |
| 2010/0289370 | A1 * | 11/2010 | Roth | H02K 1/276 310/156.53 |
| 2012/0139386 | A1 * | 6/2012 | Murakami | H02K 1/146 310/216.092 |
| 2013/0334922 | A1 | 12/2013 | Park, II et al. | |
| 2014/0191628 | A1 | 7/2014 | Nakano et al. | |
| 2015/0180301 | A1 * | 6/2015 | Kajiyama | H02K 11/40 310/89 |
| 2015/0381017 | A1 * | 12/2015 | Kitaji | H02K 11/215 310/68 B |

FOREIGN PATENT DOCUMENTS

| | | |
|---|---|---|
| CN | 105680587 | 6/2016 |
| DE | 10-2014-002100 | 8/2014 |
| EP | 1164684 | 12/2001 |
| EP | 2568578 | 3/2013 |
| EP | 2863518 | 4/2015 |
| FR | 2784815 | 4/2000 |
| JP | H7-12441 | 7/1987 |
| JP | 2003-79005 | 3/2003 |
| JP | 2005-151774 | 6/2005 |
| JP | 2009-17669 | 1/2009 |
| JP | 2013-102604 | 5/2013 |
| JP | 2015-080403 | 4/2015 |
| JP | 2015-204732 | 11/2015 |
| JP | 2015-211624 | 11/2015 |
| JP | 2016-010294 | 1/2016 |
| KR | 10-2013-0111288 | 10/2013 |
| KR | 10-2013-0125738 | 11/2013 |

OTHER PUBLICATIONS

European Search Report dated Jul. 9, 2020 issued in Application No. 18735889.0.
Chinese Office Action dated Aug. 31, 2020 issued in Application No. 201880005950.X.
Japanese Office Action dated Nov. 4, 2020 issued in Application No. 2019-531171.

* cited by examiner

| K | Cogging torque |
|---|---|
| 0.5 | 4.96[mNm] |
| 0.7 | 4.62[mNm] |
| 0.9 | 5.72[mNm] |

MOTOR AND TRANSMISSION

CROSS-REFERENCE TO RELATED PATENT APPLICATIONS

This application is a Continuation application of U.S. application Ser. No. 16/469,094, filed Jun. 12, 2019, which is a U.S. National Stage Application under 35 U.S.C. § 371 of PCT Application No. PCT/KR2018/000148, filed Jan. 4, 2018, which claims priority to Korean Patent Application No. 10-2017-0001290, filed Jan. 4, 2017, and Korean Patent Application No. 10-2017-0007858, filed Jan. 17, 2017, whose entire disclosures are hereby incorporated by reference.

TECHNICAL FIELD

The present invention relates to a motor and a transmission.

BACKGROUND ART

A motor is a device that converts electrical energy into rotational energy utilizing the force that a conductor receives in a magnetic field. Recently, as the use of motors has expanded, the role of motors has become important. Particularly, as the installation of electronic equipment in automobiles is proceeding rapidly, there is a great increase in demand for motors applied to steering systems, braking systems, design systems, gear systems, and the like.

Generally, the motor is rotated by the electromagnetic interaction between the rotor and the stator. At this time, a rotary shaft inserted in the rotor also rotates together, thereby generating the rotational driving force.

The rotor is composed of a rotor core and a magnet, and the type of the rotor is divided into a surface permanent (SPM type) type and a buried type (IPM type) according to the coupling structure of the magnet installed in the rotor core. The IPM type rotor comprises a hub having the shape of a cylinder into which a rotary shaft is inserted, core members radially coupled to the hub, and a magnet inserted between the core members.

Meanwhile, the motor is provided with a position sensor for detecting the position information of the rotor. A control unit controls the driving force of the motor by supplying or disconnecting a current to or from the corresponding coil of the stator based on the position information of the rotor detected by the position sensor.

FIG. 1 is a cross-sectional view showing a configuration of a motor according to the prior art.

Referring to FIG. 1, the external appearance of a motor 1 according to the prior art is formed by a housing 11. Inside of the housing 11 is provided with a stator 2 disposed inside the housing 2, a rotor 4 disposed inside the stator 2, and a rotary shaft 5 which is penetratingly inserted into the rotor 4 and rotated integrally with the rotor 4.

A coil 7 is wound on the stator 2 and a magnet (not shown) is mounted on the rotor 4. Therefore, due to the electrical interaction between the coil 7 and the magnet, rotation of the rotor 4 can be induced or electrical generation can be induced by the rotor being rotated. Both ends of the rotary shaft 5 can be rotatably supported by bearings 6 and 7.

On the other hand, the rotor 4 can be detected by a magnetic sensor 10a. The magnetic sensor 10a is disposed on one surface of the printed circuit board 10b facing one end of the rotary shaft 5 and detects the rotation angle of the rotor 4.

A sensor magnet 9 and a plate 8 for supporting the sensor magnet 9 are provided at one end of the rotating shaft 5 facing the magnetic sensor 10a. That is, the magnetic sensor 10a can detect the magnetic force emitted from the sensor magnet 9 and output a voltage or power proportional to the intensity of the magnetic force through an electrical sinusoidal wave (sine wave or cosine wave) signal. The rotational position of the rotor can be detected by detecting the amount of change in the rotation angle of the rotor based on the output voltage or power value.

According to the motor 1 having an above described configuration, since the magnetic sensor 10a should be disposed spaced apart from the rotation radius of the rotor 4 and the rotary shaft 5, there is a disadvantage that the rotary shaft 5 adjacent to the magnetic sensor 10a should be provided with the sensor magnet 9 separately. That is, since the sensor magnet 9 and the plate 8 for emitting magnetic force are separately present, there is a problem that the number of parts increases, thereby increasing the manufacturing cost.

DETAILED DESCRIPTION OF THE INVENTION

Technical Subject

An objective of the present invention devised for solving the foregoing problem is to provide a motor wherein the number of parts can be reduced and the manufacturing cost can be saved.

Another objective of the present invention is to provide a motor wherein the cogging torque can be reduced by improving the structure.

Technical Solution

In one embodiment, the motor comprises: a shaft; a rotor coupled to the shaft and including a magnet; a stator disposed outside the rotor and including a coil and a stator core; a cover disposed on an upper side of the rotor; and a magnetic sensor disposed between the cover and the rotor, wherein the magnetic sensor is disposed on an upper side of the magnet, a surface of the magnetic sensor facing the rotor is disposed below the uppermost end of the coil, and the length of the rotor in the shaft direction is longer than the length of the stator core in the shaft direction.

The length of the magnet may be formed to be longer than the length of the stator core.

A bearing for supporting one end of the shaft may be further comprised, wherein the shaft may comprise a first outer circumferential surface in contact with the bearing and a second outer circumferential surface in contact with the rotor, and the diameter of the first outer circumferential surface may be smaller than the diameter of the second outer circumferential surface.

The shortest distance between the magnetic sensor and the rotor may be shorter than the shortest distance between the bearing and the rotor.

The magnetic sensor may be disposed between an inner diameter and an outer diameter in a radial direction of the magnet, and disposed at one side spaced apart from the magnet in the axial direction.

The stator may further comprise an insulator for insulating the stator core from the coil, wherein the magnetic sensor may be disposed between the insulator and the shaft.

The length of the rotor in the shaft direction may be longer than the length of the stator core in the shaft direction.

A circuit board disposed with the magnetic sensor may further included, and the circuit board may be coupled to the cover perpendicularly with respect to the shaft.

The shortest distance between the circuit board and the rotor may be shorter than the shortest distance between the bearing and the rotor.

The number of the magnetic sensors may be three, and the three magnetic sensors may form an angle of 120 degrees with respect to each other.

In another embodiment, a motor may comprise: a housing; a stator disposed inner side the housing and being wound with a coil; a rotor, rotatably disposed inside the stator, comprising a magnet electromagnetically interacting with the coil; a shaft, coupled to a center portion of the rotor, being rotated with the rotor; and a circuit board, disposed at a predetermined distance spaced apart from the stator and the rotor within the internal space of the housing with respect to the axial direction, provided with a magnetic sensor on one surface thereof for detecting the position of the rotor, wherein the length L1 of the rotor in the shaft direction may be formed to be longer than the length L2 of the stator in the shaft direction.

In yet another embodiment, a motor may comprise: a rotor comprising a magnet and a rotor core; and a stator disposed outside the rotor, wherein the stator comprises a yoke and a plurality of teeth protruding from the yoke toward the rotor, the rotor core comprising a first side surface facing the stator, each of the teeth comprising a second side surface opposite to the first side surface, and wherein the curvature of the second side surface may be smaller than the curvature of the first side surface.

An opening may be provided between the plurality of teeth to form an interval therebetween, the opening having a width of K in the circumferential direction, and satisfying the equation D2=(0.9–1.1)*K*D1 wherein A distance from the center of the first side surface to the second side surface in a radial direction is D1 and a distance from an edge of the first side surface to the second side surface in the radial direction is D2.

The K can satisfy 1.3 mm≤K≤1.5 mm

The center of the imaginary circle extending from the first side surface and the center of the imaginary circle extending from the second side surface may be different from each other.

The first side surface may have a varying curvature as it travels from the center of the first side surface towards the edge along the circumferential direction.

The first side surface may have a varying curvature as it travels from the center of the first side surface towards the edge along the circumferential direction.

The curvature of the imaginary circle C1 connecting each end of the plurality of teeth may be the same as the curvature of the outer circumference of the body of the rotor.

Each of the teeth may have a width of 1.3 mm to 1.5 mm in the circumferential direction.

A transmission may comprise: a gear actuator for shifting the gear through a plurality of motors for providing a driving force; a clutch actuator for selectively operating any one of the plurality of clutches; and a control unit for controlling the power module and the clutch actuator, wherein the motor may comprise: a shaft; a rotor, coupled to the shaft, comprising a magnet; a stator, disposed on the outside of the rotor, comprising a coil and a stator core; a cover disposed above the rotor; and a magnetic sensor disposed between the cover and the rotor, and wherein the magnetic sensor is disposed on the upper side of the magnet, the surface of the magnetic sensor facing the rotor is disposed below the uppermost end of the coil, and the length of the rotor in the shaft direction may be longer than the length of the stator core in the shaft direction.

Advantageous Effects of the Invention

According to the present invention, since the magnetic sensor directly senses the magnetic force of the magnet of the rotor, there is an advantage that separate parts including the sensor magnet are not necessary.

As a result, since the number of parts can be reduced, there is an advantage that the manufacturing cost can be reduced.

Further, by forming the outer circumferential surface of the rotor core to have a curved surface whose central portion is more outwardly protruded than the edge region, there is an advantage that the cogging torque being generated in the stator according to rotation of the rotor may be reduced.

That is, as the distance from the edge region of the outer circumferential surface of the rotor core is getting closer to the teeth, the generation of the cogging torque becomes increased, therefore, in the present embodiment, a curved shape is formed on the outer circumferential surface in a way that the edge region is getting more distant from the teeth than other region, so there is an advantage that the cogging torque can be reduced.

BEST MODE

Figure 1:
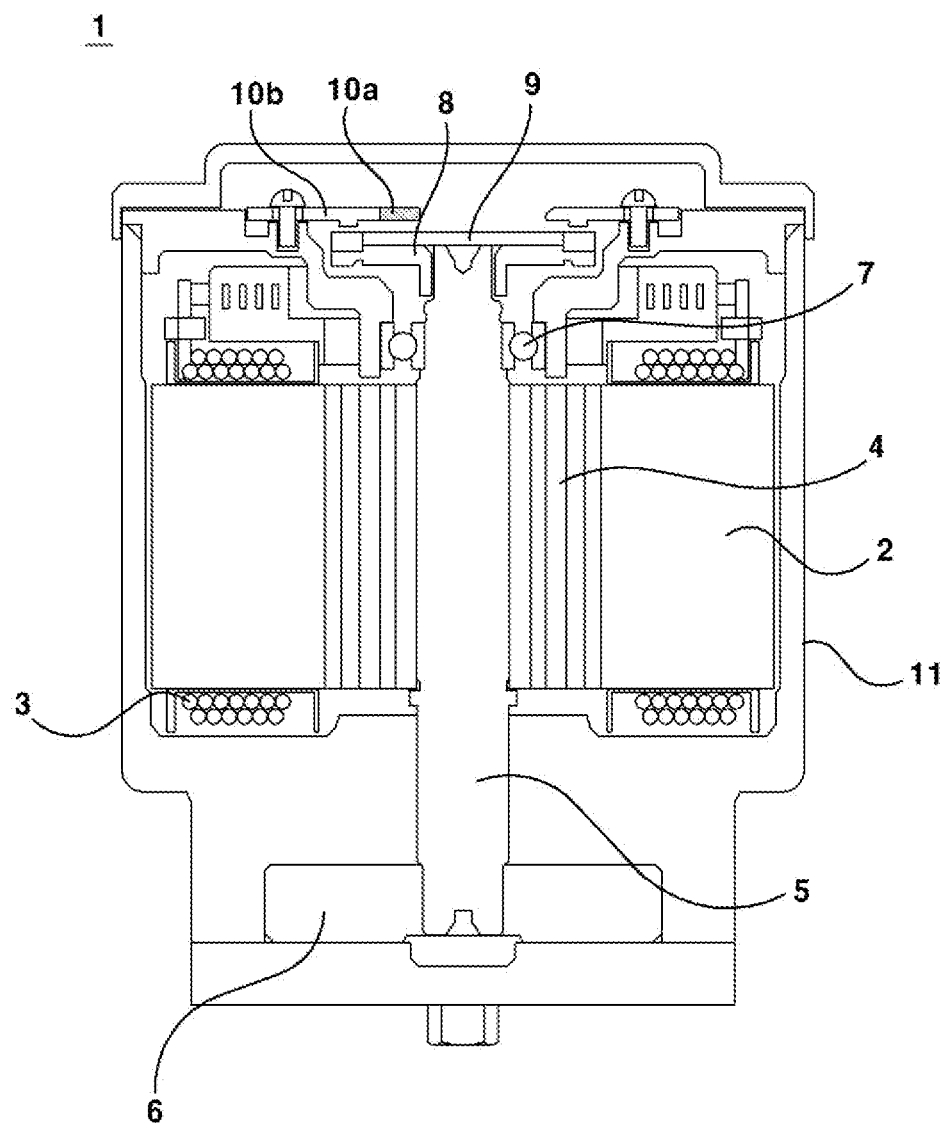
FIG. 1 is a cross-sectional view showing a configuration of a motor according to a prior art.

Since the present invention, which will be described hereinafter, may apply to various modifications and may have various exemplary embodiments, some specific exemplary embodiments are illustrated in the drawings and will be described in detail in the detailed description.

This, however, is by no means to restrict the invention to the specific embodiments, it is to be understood as embracing all modifications, equivalents and substitutes included in the spirit and scope of the present invention. If the specific description of the related art in the following description of the present invention that are determined to obscure the gist of the invention, the detailed description thereof is omitted.

The terms used in the present specification are merely used to describe particular exemplary embodiments, and are not intended to limit the present invention. Expressions in singular forms include plural forms unless the context clearly indicates otherwise. In this application, the terms "comprise," "have," and the like are intended to specify the features, numbers, steps, actions, components, parts, or one that exists combinations thereof described in the specification, but are not intended to preclude the one or more other features, numbers, steps, actions, components, parts, or the presence or possibility of combinations thereof.

Further, terms such as "first", "second" may be used to separately describe various elements, but the above elements shall not be restricted to the above terms. These terms are only used to distinguish one element from the other.

Figure 2:
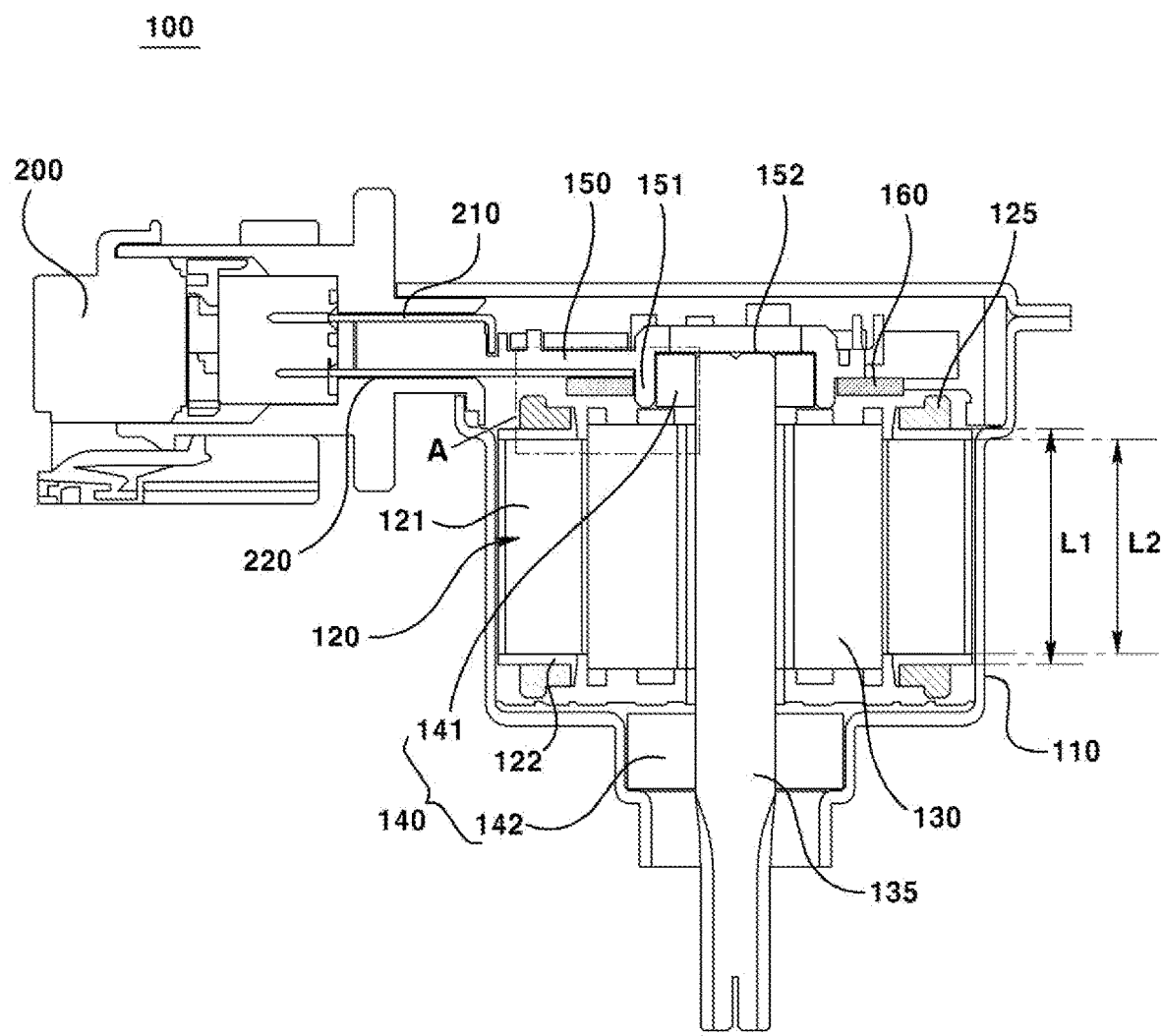
FIG. 2 is a cross-sectional view showing a configuration of a motor according to an embodiment of the present invention.
Figure 3:
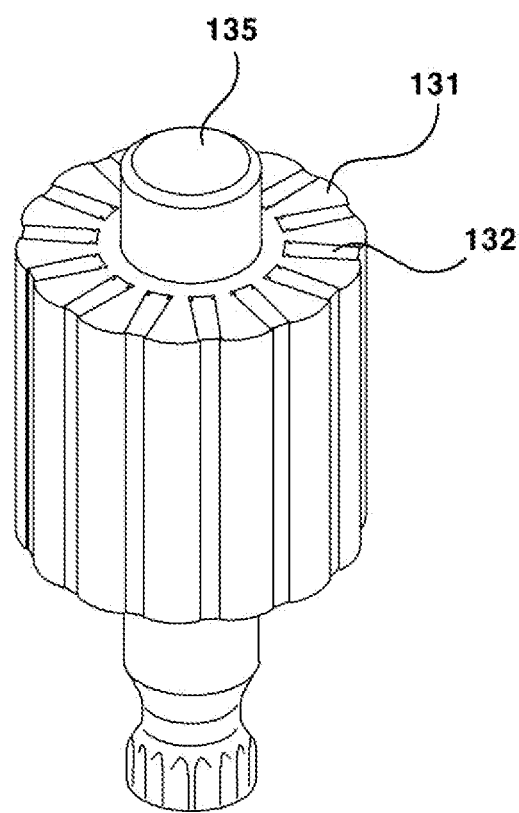
FIG. 3 is a perspective view of a rotor according to an embodiment of the present invention.

FIG. 2 is a cross-sectional view showing a configuration of a motor according to an embodiment of the present invention, and FIG. 3 is a perspective view of a rotor according to an embodiment of the present invention.

Referring to FIGS. 2 and 3, the motor 100 according to the embodiment of the present invention comprises a housing 110, a stator 120 disposed inner side of the housing 110, a rotor 130 rotatably disposed inner side of the stator 120, and a shaft 135 which is penetratingly inserted into the rotor 130 and rotated integrally with the rotor 130.

The housing 110 is formed in the shape of a cylinder and has a space in which the stator 120 and the rotor 130 can be mounted. The shape and material of the housing 110 can be variously modified, but a metal material that can endure high temperatures may be selected.

A separate cover 150 to which a plurality of components are coupled is coupled to the housing 110. The cover 150 may be disposed above the rotor 130. One side of the cover 150 may be accommodated inside the housing 110 and the other side may be extended towards the outside of the housing 110. For this purpose, a separate hole (not shown) may be formed in the housing 110 for being inserted with the cover 150.

Here, the region accommodated inside the housing 110 supports the stator 120, the rotor 130, the shaft 135, and other separate parts. A connector 200 is coupled to an area disposed outside the housing 110 to transmit a control command to the motor 100 or provide a power source.

In detail, a separate plug (not shown) may be mounted on the connector 200. The connector 200 may be electrically coupled to a plurality of parts disposed inside of the housing 110 through terminals 210 and 220. For example, the terminals 210 and 220 comprise a power terminal 210 and an input terminal 220. Accordingly, when the plug is mounted on the connector 200, control commands can be transmitted to each of the parts through the terminals 210 and 220, or provide a power source.

The housing 110 shields the stator 120 and the rotor 130 from the outside by the coupling with the cover 150. Further, a cooling structure (not shown) may be further be included so that the internal heat can be easily exhausted. Such a cooling structure may be an air-cooling or water-cooling structure, and the shape of the housing 110 may be appropriately modified depending on the cooling structure.

The stator 120 is inserted into the inner space of the housing 110. The stator 120 comprises a coil 125 being wound around the stator core 121. The stator core 121 may be an integrated type core whose cross-section is formed in the shape of a ring or a core wherein a plurality of divided cores are combined. The stator 120 may be provided with an insulator 122 for insulating the coil 125.

The stator 120 may be appropriately modified depending on the type of the motor. For example, in the case of a DC motor, coils may be wound on an integrated type stator core, and in the case of a three-phase control motor, it may be fabricated so that U, V, and W phases can be inputted to a plurality of coils, respectively.

The rotor 130 is rotatably disposed inner side of the stator 120. The rotor 130 is mounted with the magnet 132 and being rotated by the electromagnetic interaction with the coil 125 of the stator 120.

Referring to FIG. 3, the rotor 130 according to the present embodiment may be disposed with the magnet 132 as a magnetic flux concentrating spoke type. In detail, the rotor 130 may comprise a plurality of rotor cores 131 disposed radially with respect to the center for forming pockets, and a plurality of magnets 132 to be inserted into the pockets. That is, it may be understood that the magnet 132 is fitted in the pocket formed between adjacent rotor cores 131. In addition, the magnet 132 may be magnetized in the circumferential direction and disposed in a way that the same polarity of the neighboring magnet is facing with each other.

However, the above described arrangement type of the magnet 132 is merely an example, and it is not limited thereto and may be disposed in various forms. For example, the rotor may be embodied in a form in which the rotor core is formed in the shape of a circle and the magnet is disposed on the outer circumferential surface thereof. That is, the magnet 132 may be coupled to the rotor core 131 in the form of an interior permanent magnet (IPM) or a surface permanent magnet (SPM).

The shaft 135 is coupled to the center of the rotor 130. Accordingly, when the rotor 130 rotates, the shaft 135 also rotates. At this time, the upper and lower ends the shaft 135 are supported by a bearing 140. In detail, a first bearing 142 disposed on one side of the shaft 135 and a second bearing 141 disposed on the other side support the upper and lower ends of the shaft 135, respectively.

Alternatively, the rotor 130 and the shaft 135 may be integrally formed. That is, when manufacturing, the rotor 130 may be injection-molded while the shaft 135 is being coupled.

The cover 150 may be formed with a support groove 152 for supporting one end of the shaft 135 and the second bearing 141. The support groove 152 is recessedly formed on one surface of the cover 150 and may accommodate one end of the shaft 135 being supported by the second bearing 141. The second bearing 141 may be disposed above a magnetic sensor 161, which will be described later.

Figure 4:
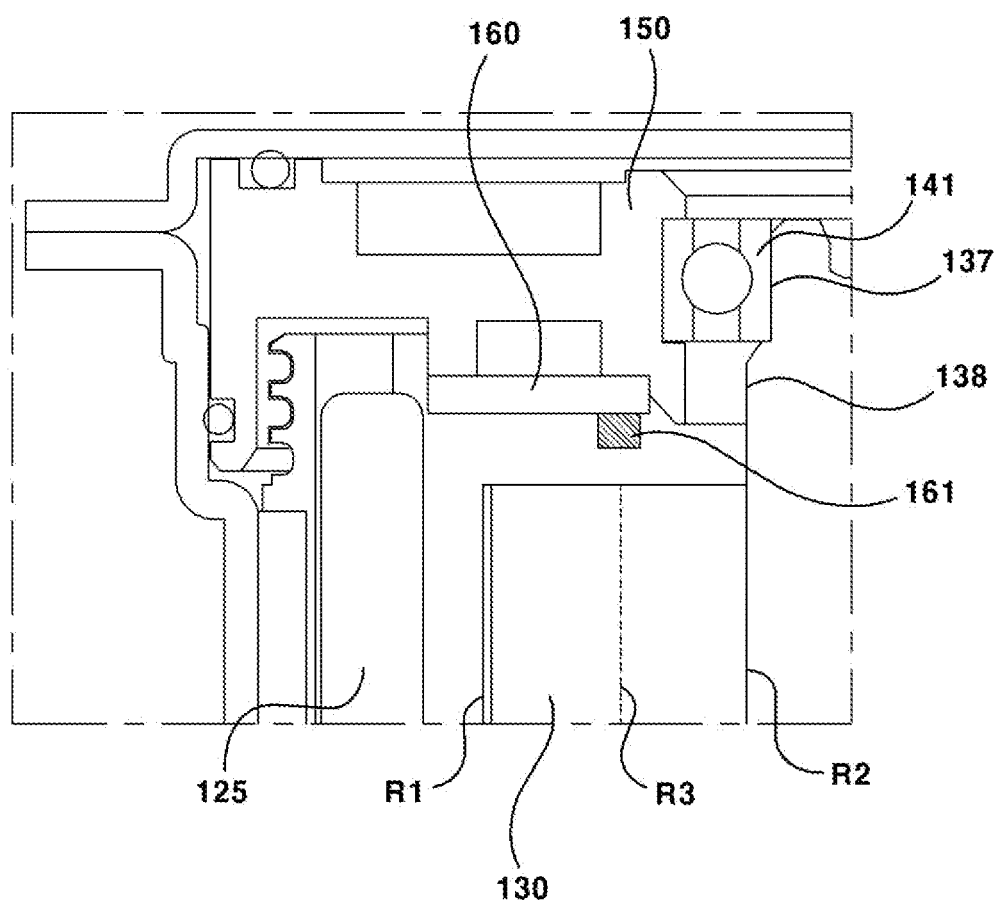
FIG. 4 is an enlarged view of a portion A in FIG. 2.

The shaft 135 may be formed with an outer circumferential surface having a plurality of cross-sectional areas. Referring to FIG. 4, the shaft 135 may comprise a first outer circumferential surface 137 being contacted with the second bearing 141 and a second outer circumferential surface 138 being contacted with the rotor 130. At this time, the diameter of the first outer circumferential surface 137 may be smaller than the diameter of the second outer circumferential surface 138.

A circuit board 160 is disposed between the cover 150 and the rotor 130. A plurality of electronic parts are embedded in the circuit board 160. For example, the circuit board 160 may be mounted with a magnetic sensor 161 for detecting the rotation of the rotor 130, which will be described later, or an inverter. In addition, the power supply terminal 210 and the input terminal 220 in the circuit board 160 are electrically connected so that a power may be provided to each of the electronic parts or a control command may be transmitted.

A through hole through which the shaft 135 is penetrating may be formed in the circuit board 160. As a result, when the shaft 135 is fitted into the through hole, the circuit board 160 may be disposed at the outer side in the radial direction with respect to the shaft 135.

The circuit board 160 may be disposed between the inner and outer diameters in the radial direction of the magnet 132 and disposed at one side spaced apart from the magnet 132 in the axial direction. The circuit board 160 may be disposed in a direction perpendicular to the shaft 135. At this time, the shortest distance between the circuit board 160 and the rotor 130 may be shorter than the shortest distance between the second bearing 141 and the rotor 130.

Hereinafter, the structure for detecting the position of the rotor 130 will be described.

FIG. 4 is an enlarged view of a portion A in FIG. 2.

Referring to FIGS. 2 and 4, a magnetic sensor 161 for detecting the position of the rotor 130 is provided on an outer surface, facing the stator 120 and the rotor 130, of the circuit board 160. The magnetic sensor 161 may be disposed at a predetermined distance spaced apart from the stator 120 and the rotor 130 with respect to the axial direction in the inner space of the housing 110. More specifically, the magnetic sensor 161 may be disposed above the magnet 132 for detecting the magnetic flux of the magnet 132. Because of this, it may be understood that the position of the magnetic sensor 161 is disposed between the stator 120 and the shaft 135 or between the insulator 122 and the shaft 135.

For example, the shortest distance between the magnetic sensor 161 and the rotor 130 may be 3 mm to 10 mm. The surface of the magnetic sensor 161 facing the rotor 130 may be disposed below the uppermost end of the coil 125.

The magnetic sensor 161 may sense a magnetic force emitted from the magnet 132 and output a voltage or a power value proportional to the magnetic force through an electric sinusoidal wave (sine wave or cosine wave) signal. The position of the rotor 130 can be detected by detecting the amount of change in the rotation angle of the rotor 130 based on the output voltage or power value. For example, the magnetic sensor 161 may be a Hall IC.

The magnetic sensors 161 may be plurally provided. Three of the magnetic sensors 161 may be provided on one surface of the circuit board 160 within a same radius with respect to the shaft 135. The three of the magnetic sensors 161 may form an angle of 120 degrees with respect to each other.

The magnetic sensor 161 is disposed between the inner and outer diameters in the radial direction of the magnet 132, and may be disposed at one side spaced apart from the magnet 132 in the axial direction. More specifically, the magnetic sensor 161 may be positioned to face the center area of the cross-sectional width of the rotor core 131.

When the outer diameter of the rotor core 131 is R1 and the inner diameter is R2, the center R3 in the radial direction of the rotor core 131 can be defined as follows.

$$R3=(R1+R2)/2$$

That is, the magnetic sensor 161 may be disposed relatively closer to an area facing the R3 in the outer surface of the rotor core 131. Because of this, the magnetic sensor 161 is disposed in a region where the magnetic force of the magnet 132 is relatively high, therefore it is advantageous that a signal for detecting the position of the rotor 130 can be received more accurately.

Meanwhile, when the disposed direction of the shaft 135 is referred to as an axial direction, the length of the rotor 130 in axial direction is to be formed longer than that of the stator 120 in axial direction. That is, the length of the rotor 130 in the shaft direction may be longer than the length of the stator core 121 in the shaft direction.

When the length of the rotor 130 in axial direction is L1 and the length of the stator 120 in axial direction is L2, the length L1 is longer than the length L2. Therefore, there is an advantage that the magnetic sensor 161 can detect the magnetic force of the magnet 132 more accurately since the rotor 130 in which the magnet 132 is disposed can be located relatively closer to the magnetic sensor 161. For an example, the L1 may be 1.1 to 1.3 times the L2. The length relationship between the L1 and the L2 is understood as a value for allowing the rotor 130 to perform an electromagnetic interaction with the stator 120, and at the same time, letting the magnetic force of the magnet 132 of the rotor 130 be easily reached to the magnetic sensor 161.

Due to this, the shortest distance between the magnetic sensor 161 and the rotor 130 may be shorter than the shortest distance between the second bearing 141 and the rotor 130. In addition, the magnetic sensor 161 may overlap the shaft 135 in the vertical direction of the shaft 135.

In a modified embodiment, when the magnetic sensor 161 is disposed on the upper side of the stator 120 and the rotor 130, the distance from the upper surface of the rotor 130 to the magnetic sensor 161 may be formed to be shorter than the distance from the upper surface of the stator 120 to the magnetic sensor 161.

Figure 5:
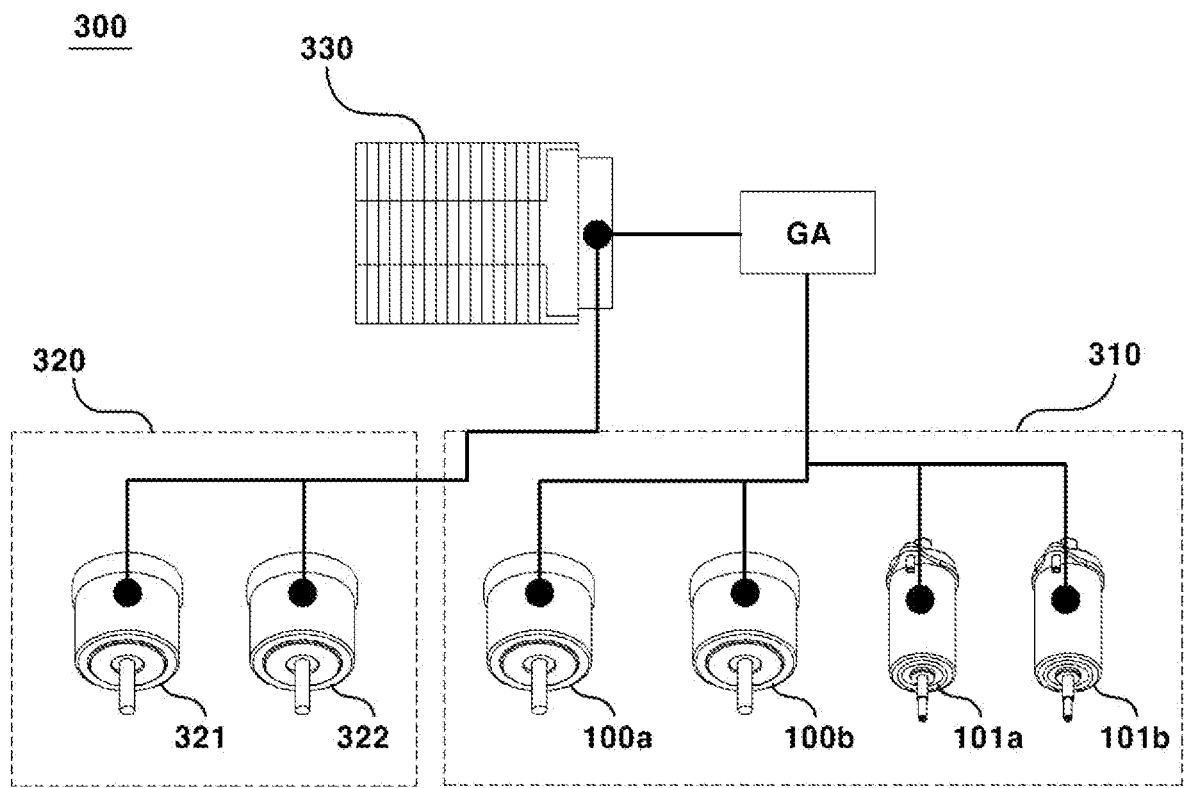
FIG. 5 is a system diagram illustrating a system of a transmission according to an embodiment of the present invention.

FIG. 5 is a system diagram illustrating a system of a transmission according to an embodiment of the present invention.

The motor 100 according to the embodiment of the present invention may be provided in a gear actuator for shifting gears of the transmission 300. For convenience of description, a plurality of motors disposed in the transmission 300 will be denoted by the same reference numerals and will be referred to as a first motor 100a and a second motor 100b, respectively, and the description will be made by assigning different reference numerals.

More specifically, the transmission 300 according to the present embodiment comprises a gear actuator 310 for shifting a gear by providing a driving force through a plurality of clutches, a clutch actuator 320 for selectively operating any one of the plurality of clutches, and a control unit 330 for controlling the clutch actuator 320 and the gear actuator 310.

The control unit 330 controls the overall operation of the transmission 300. For example, the gear actuator 310 may play the role of changing the gear ratio to have a proper gear ratio depending on a change in the speed of the vehicle.

The clutch actuator 320 is provided with a plurality of clutch motors 321 and 322. The number of the plurality of clutch motors 321 and 322 may be two corresponding to the number of motors 100a and 100b and the solenoids 101a and 101b, both are two, respectively. A first clutch motor 210 of the plurality of clutch motors 321 and 322 is understood as a motor for controlling the operation of the first motor 100a and the first solenoid 101a for converting the odd-numbered gears. A second clutch motor 322 is understood as a motor for controlling the operation of the second motor 100b and the second solenoid 101b for converting the even-numbered gears.

In other words, the first motor 100a and the first solenoid 101a are understood as a first clutch, the second motor 100b and the second solenoid 101b are understood as a second clutch. Therefore, an operation of the each of the clutches can be alternatively selected by the plurality of clutch motors 321 and 322.

For example, when it is assumed that the driver starts the operation in the state where the gear is initially in the neutral position, the first clutch motor 210 is in ON-state and the second clutch motor 322 is in OFF-state. According to the ON-state of the first clutch motor 321, the first motor 100*a* and the first solenoid 101*a* can be operated as a first stage gear in the odd-numbered gear unit by the operation of the first motor 100*a* and the first solenoid 101*a*. At this time, the second motor 100*b* and the second solenoid 101*b* shall be in standby state with the input shaft at the second stage in the even-numbered gear unit. Next, as the speed increases, the first clutch motor 321 will be in OFF-state and the second clutch motor 322 will be in ON-state. At this time, depending on the ON-state of the second clutch motor 322, the gears at second stage in the even-numbered gear unit can be operated by the operation of the second motor 100*b* and the second solenoid 101*b*. Here, the ON-state and the OFF-state are understood as the states for transmitting and blocking of power, respectively.

Accordingly, the clutch actuator 320 and the gear actuator 310 can shift the gear to an appropriate gear ratio through an operation considering the vehicle speed, in accordance with a control command from the control unit 330.

According to the motor 100 according to the above configuration, since the magnetic sensor 161 directly senses the magnetic force of the magnet 150 of the rotor 130, there is an advantage that separate parts including the sensor magnet are not necessary. As a result, there is an advantage that the number of parts is reduced, thereby lowering the manufacturing cost.

Figure 6:
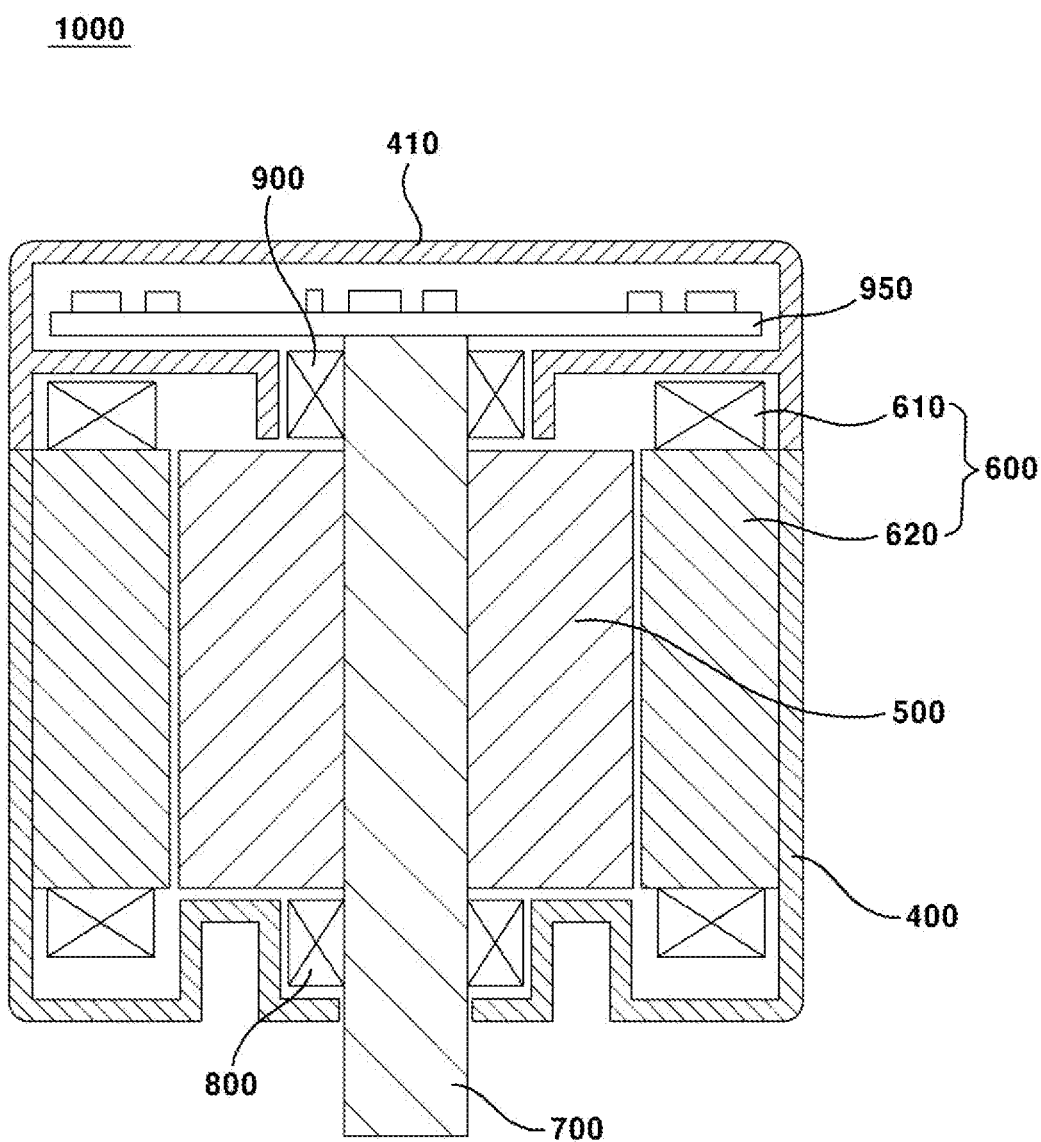
FIG. 6 is a conceptual diagram of a motor according to a second embodiment of the present invention.

FIG. 6 is a conceptual diagram of a motor according to a second embodiment of the present invention.

Referring to FIG. 6, a motor 1000 according to a second embodiment of the present invention comprises a housing 400, a stator 600 disposed inner side the housing 400, a rotor 500 rotatably disposed inner side of the stator 600, and a shaft 400 that is penetratingly inserted into the rotor 500 and being rotated integrally with the rotor 500.

The housing 400 is formed in the shape of a cylinder and has a space in which the stator 600 and the rotor 500 can be mounted. The shape and material of the housing 400 can be variously modified, but a metal material that can endure high temperatures may be selected.

The housing 400 is coupled to the cover 410 to shield the stator 600 and the rotor 500 from the outside. Further, a cooling structure (not shown) may be further included so that the internal heat can be easily exhausted. Such a cooling structure may be an air-cooling or water-cooling structure, and the shape of the housing 400 may be appropriately modified according to the cooling structure.

The stator 600 is inserted into the inner space of the housing 400. The stator 600 comprises a coil 650 being wound around a tooth 620. The yoke 610 may be an integrated type core formed in the shape of a ring in cross section or a core to which a plurality of divided cores are coupled. Similarly, the rotor 500 may also be a core to which a plurality of divided cores are coupled.

The stator 600 may be appropriately modified according to the type of the motor. For example, in the case of a DC motor, coils may be wound on an integrated type teeth, and in the case of a three-phase control motor, it may be fabricated so that U, V, and W phases can be inputted to a plurality of coils, respectively.

The rotor 500 is disposed so as to be rotatable with the stator 600. The rotor 500 is mounted with a magnet and rotated by electromagnetic interaction with the stator 600.

The shaft 400 is coupled to the center of the rotor 500. Accordingly, when the rotor 500 is rotated, the shaft 400 is also rotated. At this time, the upper and lower ends of the shaft 400 are supported by a first bearing 800 disposed on one side and a second bearing 900 disposed on the other side, respectively.

A plurality of electronic parts are internally installed in the circuit board 950. For an example, a hole IC (not shown) for detecting the rotation of the rotor 500 may be mounted on the circuit board 950, or an inverter may be mounted.

Figure 7:
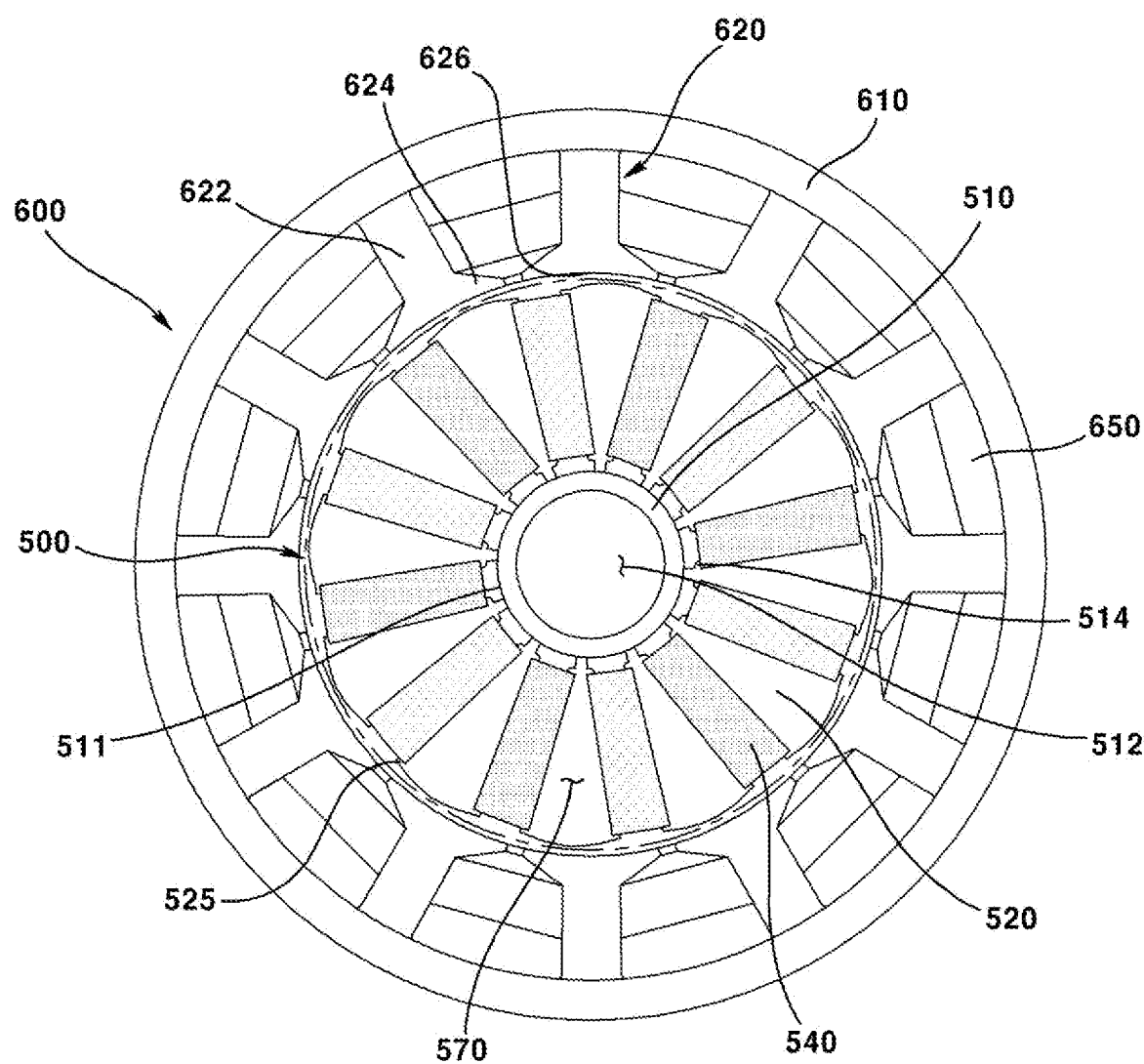
FIG. 7 is a cross-sectional view of a stator and a rotor according to a second embodiment of the present invention.
Figure 8:
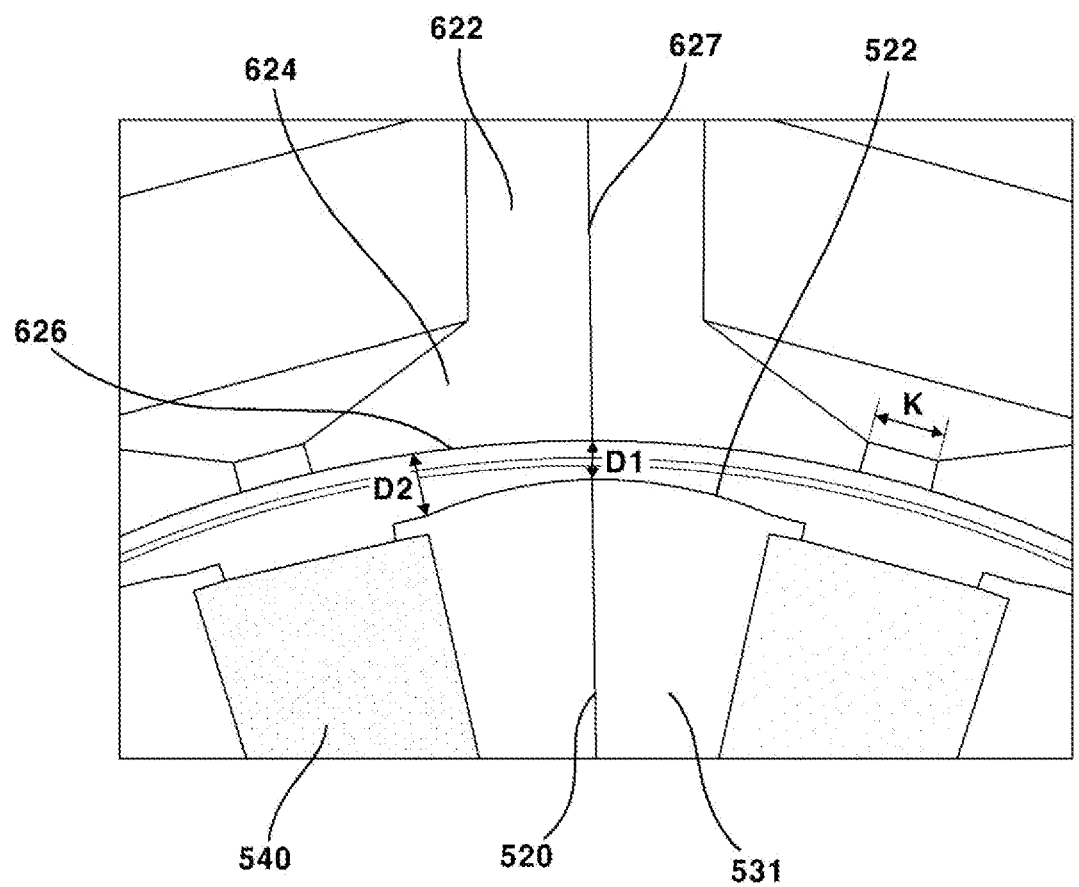
FIG. 8 is an enlarged view of a portion A in FIG. 7.

FIG. 7 is a cross-sectional view of a stator and a rotor according to a second embodiment of the present invention, and FIG. 8 is an enlarged view of a portion A in FIG. 7.

Referring to FIGS. 7 and 8, a motor 1000 according to a second embodiment of the present invention comprises a stator 600 and a rotor 500 rotatably disposed inside the stator 600.

In detail, the stator 600 comprises a yoke 610 having the shape of a cylinder and a tooth 620 being protrudedly formed from the inner circumferential surface of the yoke 610.

The yoke 610 made of a metal is disposed inside the housing 400. A space in which the rotor 500 is disposed is formed inner side the yoke 610. The yoke 610 is formed as a single body using a mold in a way that a plurality of teeth 620 are protrudedly formed at regular intervals in the same direction.

The teeth 620 are plurally provided, spaced apart from each other with a predetermined interval, and protruded from the inner circumferential surface of the yoke 610. In other words, the teeth 620 are formed radially along the inner circumferential surface of the yoke 610. As a result, each end of the plurality of teeth 620 may be directed to the center of the rotor 500.

The tooth 620 may comprise a tooth body 622 through which the coil 650 is wound and a distal end portion 624 formed at the tip of the tooth body 622. The distal end portion 624 may form a rim shape in which a part of the outer surface of the tooth body 622 protrudes. Thus, the coil 650 can be wound on the tooth body 622 wherein both ends thereof are divided by the distal end portion 624 and the yoke 610.

A curved surface whose center is recessed outward may be formed on the surface of the tooth 620 facing the rotor 500, that is, the inner circumferential surface of the teeth 32. As illustrated, due to the shape of a curved surface of the tooth 620, the curvature of the inner circumferential surface 626 of the tooth 620 and the outer circumferential surface of the yoke 610 or the rotor body 510 may be equal to each other. It can be understood that the curvature of the imaginary circle C1 extending each end of the plurality of teeth 620 is equal to the curvature of an outer circumferential surface 511 of the rotor body 510 which will be described later.

The rotor 500 comprises a rotor body 510 formed with a through hole 512 through which the shaft 400 is inserted, a plurality of rotor core 520 radially disposed with respect to the through hole 512, thereby forming pockets 570, and a plurality of magnets 540 being inserted into the pockets 570.

The rotor body 510 is not particularly limited as long as the rotor core 520 and the magnet 540 can be fixed thereto. For example, the rotor body 510 may be manufactured by injection molding in a state where the rotor core 520 is radially disposed inside the mold. Later, the magnet 540 is inserted into the pocket 570. As another example, the rotor body 510 may be formed integrally with the rotor core 520 and the magnet 540 through injection molding. As another example, it is also possible to separately insert the rotor core 520 and the magnet 540 after manufacturing the rotor body 510 having the shape of a cylinder formed with a plurality of insertion holes in advance.

Any material may be used as a material for the rotor body 510 without limitation as long as it can shield the magnetic force. For an example, the material of the rotor body 510 may be a resin.

The rotor core 520 is disposed outside the rotor body 510 and disposed radially with respect to the through hole 512. The pocket 570 may be defined as a space formed by the outer circumferential surface of the rotor body 510 and the respective side surfaces of the adjacent rotor core 520.

The rotor core 520 is formed of a metal material and forms a magnetic flux path between the magnets 540. The inner end of the rotor core 520 is coupled to the outer circumferential surface of the rotor body 510 and the outer circumferential surface 522 of the rotor core 520 is exposed to the outside of the rotor body 510 so as to face the teeth 620. Meanwhile, a gap is formed between the rotor core 520 and the teeth 620 for a smooth rotation of the rotor 500.

The outer side of the rotor core 520 may be formed with an outer threshold 525 extending in a direction opposite to the side of the adjacent rotor core 520 wherein the magnet 540 is accommodated. The outer threshold 525 restrains the magnet 540 from being detached when the motor rotates. Likewise, an inner threshold 514 may be formed on one side of the side surface of the rotor core 520 which is inwardly spaced apart from the outer threshold 525. Owing to this, the outer circumferential surface and the inner circumferential surface of the magnet 540 are supported by the outer threshold 525 and the inner threshold 514 so that the magnet 540 can be firmly fixed in the pocket 570.

The magnet 540 may be disposed with a magnetic flux concentrating spoke type. In detail, the magnet 540 may be magnetized in the circumferential direction and disposed in a way that the same polarity of the neighboring magnet is facing with each other.

Hereinafter, the cogging torque reducing structure which is a main part of the present invention will be described.

Referring to FIG. 8, the outer circumferential surface 522 of the rotor core 520 has a curved surface such that the center portion thereof is more outwardly protruded than the edge region. When the center 531 of the rotor core 520 is disposed at a position facing the center 627 of the tooth 620 by the rotation of the rotor 500, the distance from the outer circumferential surface of the rotor core to the inner circumferential surface of the tooth 620 may be defined with D1 and D2 each having different lengths. Here, D1 denotes a distance in the diametral direction from the central region of the outer circumferential surface of the protruded rotor core 520 to the inner circumferential surface of the tooth 620, D2 denotes a distance in the diametral direction from the edge region of the outer circumferential surface of the rotor core 520 to the inner circumferential surface of the tooth 620. That is, it can be understood as D1 is the closest distance formed between the outer circumferential surface of the rotor core 520 and the inner circumferential surface of the tooth 620, and it can be understood as D2 is the farthest distance between the outer circumferential surface of the rotor core 520 and the inner circumferential surface of the tooth 620.

At this time, D1 and D2 can satisfy the following equations.

$$D2 = K^*D1 \, (1.3 \leq K \leq 1.5)$$

Therefore, D1 and D2 are different from each other, and the value of D2 is formed to be larger than the value of D1.

In summary, when the outer circumferential surface 522 of the rotor core 520 is referred to as a first side surface and the inner circumferential surface 626 of the tooth 620 facing the first side surface is referred to as a second side surface, the curvature of the second side surface is formed to be smaller than the curvature of the first side surface.

As a result, the center of the imaginary circle extending from the first side surface and the center of the imaginary circle extending from the second side surface are different from each other.

The curvature of the first side surface may vary as it travels from the center of the first side surface towards the edge along the circumferential direction. Unlike this, the curvature of the first side surface may be constant along the circumferential direction. The curvature of the first side may be variously set within a range in which the value D2 is larger than the value D1.

An opening may be formed by K between the adjacent teeth 620. In detail, a gap may be formed between the distal end portion 624 disposed at the distal end of the tooth 620 and the adjacent distal end portion in the circumferential direction. In this case, K denotes a circumferential width formed between the distal end portions of the teeth 620 adjacent to each other. The range of the K value may satisfy 1.3 mm ≤ K ≤ 1.5 mm.

Figures 9, 10:
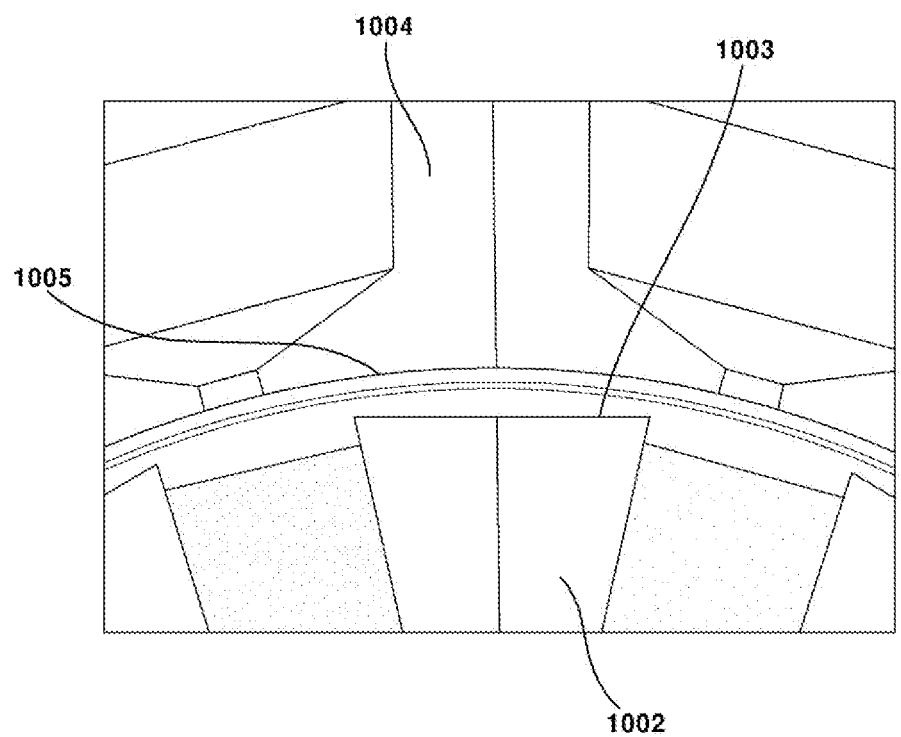
FIG. 9 is a cross-sectional view showing a state of a stator and a rotor according to the prior art.
FIG. 10 is a table showing the cogging torque values according to the change in the K value.

FIG. 9 is a cross-sectional view showing a state of a stator and a rotor according to the prior art, and FIG. 10 is a table showing the cogging torque values according to the change in the K value.

Referring to FIG. 9, the outer circumferential surface 1003 of the rotor core 1002 according to the prior art is formed to be a flat surface. Therefore, there is a problem that due to the curved shape of the inner circumferential surface 1005 of the end portion of the stator 1004, the edge portion of the outer circumferential surface 1003 of the rotor core 1002 is closer to the inner circumferential surface 1005 than the central portion, thereby increasing the cogging torque. That is, according to a motor of the prior art, since the distance between the outer circumferential surface 1003 of the rotor core 1002 and the inner circumferential surface 1005 of the stator 1004 is not uniform, there is a disadvantage in that the noise increases according to the rotation of the rotor and the cogging torque increases, thereby degrading the efficiency of the motor.

However, according to the second embodiment, by forming the outer circumferential surface 522 of the rotor core 520 to have a curved surface whose central portion is more outwardly protruded than the edge region, there is an advantage that the cogging torque being generated in the stator 600 according to rotation of the rotor can be reduced. That is, as the distance from the edge region of the outer circumferential surface 522 of the rotor core 520 to the tooth 620 is increased, the cogging torque is increased, however, in the present embodiment, by forming a curved shape in the outer circumferential surface 522 in a way that the edge region is further spaced apart from the tooth 620 than the other region, and thus, there is an advantage in that the cogging torque can be reduced.

Besides, as shown in FIG. 10, it is confirmed that the cogging torque is minimized when the K value is 0.7 mm. It can be understood that it has a critical meaning that the cogging torque can be minimized at 0.7 which is a value considering both the distance between the adjacent teeth 620 along the circumferential direction and the curvature of the outer circumferential surface of the rotor core 520.

It should be noted that the exemplary embodiments disclosed in the drawings are merely examples of specific examples for the purpose of understanding, and are not intended to limit the scope of the present invention. It will be apparent to those skilled in the art that other modifications based on the technical spirit of the present invention are possible in addition to the exemplary embodiments disclosed herein.

The invention claimed is:

1. A motor comprising:
a shaft that extends in an axial direction from a lower end to an upper end;
a rotor coupled to the shaft and including a magnet, the rotor having an upper rotor end and a lower rotor end;
a stator disposed outside the rotor and including a coil and a stator core;
a cover disposed on the upper rotor end of the rotor, and configured to support the upper end of the shaft;
a magnetic sensor disposed between the cover and the upper rotor end of the rotor such that the magnetic sensor is closer to the upper rotor end of the rotor than the lower rotor end of the rotor;
a first bearing configured to support the upper end of the shaft; and
a second bearing configured to support the lower end of the shaft,
wherein the magnetic sensor is disposed above the magnet, in a direction parallel to the axial direction, to sense a magnetic flux of the magnet,
wherein a surface of the magnetic sensor facing the upper rotor end of the rotor is disposed below an uppermost end of the coil,
wherein an axial length of the rotor is longer than an axial length of the stator core, and
wherein a shortest distance between the magnetic sensor and the upper end of the rotor is shorter than a shortest distance between the first bearing and the upper end of the rotor.

2. The motor according to claim 1,
wherein the shaft includes a first outer circumferential surface in contact with the first bearing and a second outer circumferential surface in contact with the rotor, and
wherein a diameter of the first outer circumferential surface is smaller than a diameter of the second outer circumferential surface.

3. The motor according to claim 1, wherein the magnetic sensor overlaps the shaft in a direction perpendicular to the axial direction of the shaft.

4. The motor according to claim 1, wherein the magnetic sensor is disposed to face the magnet in the direction parallel to the axial direction.

5. The motor according to claim 1, wherein the magnetic sensor is disposed between an inner diameter and an outer diameter of the magnet in a radial direction, and the magnetic sensor is axially spaced apart from the magnet in the direction parallel to the axial direction and disposed on one side.

6. The motor according to claim 1, wherein the stator includes an insulator insulating the stator core and the coil, and the magnetic sensor is disposed between the insulator and the shaft.

7. The motor according to claim 1, wherein the magnetic sensor is disposed between the stator and the shaft.

8. The motor according to claim 2, wherein the first bearing is disposed above the magnetic sensor.

9. The motor according to claim 2, comprising a circuit board on which the magnetic sensor is disposed,
wherein the circuit board is coupled to the cover perpendicular to the shaft.

10. The motor according to claim 9, wherein the circuit board includes a through hole through which the shaft is to be provided, and
the circuit board is disposed radially outside the shaft.

11. The motor according to claim 9, wherein the circuit board is disposed between an inner diameter and an outer diameter of the magnet in a radial direction, and the circuit board is axially spaced apart from the magnet in the direction parallel to the axial direction and disposed on one side.

12. The motor according to claim 1, wherein the rotor and the shaft are integrally formed.

13. The motor according to claim 9, wherein a shortest distance between the circuit board and the rotor in the direction parallel to the axial direction is shorter than a shortest distance between the first bearing and the rotor in the direction parallel to the axial direction.

14. The motor according to claim 1, wherein a shortest distance from the magnetic sensor to the rotor in the direction parallel to the axial direction is 3 mm to 10 mm.

15. The motor according to claim 1, wherein the magnetic sensor includes at least two magnetic sensors.

16. The motor according to claim 15, wherein the magnetic sensor includes three magnetic sensors, and
the three magnetic sensors form an angle of 120 degrees to each other.

17. A motor comprising:
a housing;
a stator is disposed inside the housing and has a coil wound thereon;
a rotor rotatably disposed inside the stator and including a magnet in electromagnetic interaction with the coil;
a shaft coupled to a central portion of the rotor and rotating together with the rotor, the shaft to extend in an axial direction from a lower end to an upper end;
a cover configured to support the upper end of the shaft; and
a circuit board having a magnetic sensor arranged to be spaced apart from the stator and the rotor by a predetermined distance in a direction parallel to the axial direction in an inner space of the housing and sensing a magnetic force of the magnet on one surface to detect a position of the rotor, the circuit board disposed between the cover and the upper rotor end of the rotor;
a first bearing configured to support the upper end of the shaft; and
a second bearing configured to support the lower end of the shaft,
wherein an axial length of the rotor in the direction parallel to the axial direction is longer than an axial length of the stator in the direction parallel to the axial direction, and
wherein a shortest distance between the magnetic sensor and the upper rotor end of the rotor is shorter than a shortest distance between the first bearing and the upper rotor end of the rotor.

18. A transmission comprising:
a gear actuator for shifting a gear through a plurality of clutches for providing a driving force;
a clutch actuator for selectively operating any one of the plurality of clutches; and
a control unit configured to control the gear actuator and the clutch actuator,
wherein the motor comprises:

a shaft that extends in an axial direction from a lower end to an upper end;
a rotor coupled to the shaft and including a magnet, the rotor having an upper rotor end and a lower rotor end;
a stator disposed outside the rotor and including a coil and a stator core;
a cover disposed on the upper rotor end of the rotor, and configured to support the upper end of the shaft;
a magnetic sensor disposed between the cover and the upper rotor end of the rotor such that the magnetic sensor is closer to the upper rotor end of the rotor than the lower rotor end of the rotor;
a first bearing configured to support the upper end of the shaft; and
a second bearing configured to support the lower end of the shaft,
wherein the magnetic sensor is disposed above the magnet, in the direction parallel to the axial direction, to sense a magnetic flux of the magnet,
wherein a surface of the magnetic sensor facing the upper rotor end of the rotor is disposed below an uppermost end of the coil,
wherein an axial length of the rotor is longer than an axial length of the stator core, and
wherein a shortest distance between the magnetic sensor and the upper rotor end of the rotor is shorter than a shortest distance between the first bearing and the upper rotor end of the rotor.

* * * * *